(12) United States Patent
Son et al.

(10) Patent No.: US 9,733,569 B2
(45) Date of Patent: Aug. 15, 2017

(54) MASK, METHOD OF MANUFACTURING THE SAME, AND METHOD OF MANUFACTURING A DISPLAY PANEL USING THE SAME

(71) Applicant: SAMSUNG DISPLAY CO. LTD., Yongin, Gyeonggi-do (KR)

(72) Inventors: Yong Son, Suwon-si (KR); Min Kang, Seoul (KR); Bong-Yeon Kim, Seoul (KR); Hyun-Joo Lee, Seoul (KR); Jin-Ho Ju, Seoul (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 107 days.

(21) Appl. No.: 14/697,068

(22) Filed: Apr. 27, 2015

(65) Prior Publication Data
US 2016/0109793 A1    Apr. 21, 2016

(30) Foreign Application Priority Data
Oct. 15, 2014    (KR) .......................... 10-2014-0139109

(51) Int. Cl.
| | | |
|---|---|---|
| *G03F 1/38* | (2012.01) | |
| *G03F 7/32* | (2006.01) | |
| *G02B 5/18* | (2006.01) | |
| *G03F 7/00* | (2006.01) | |
| *G03F 7/16* | (2006.01) | |
| *G03F 7/20* | (2006.01) | |

(52) U.S. Cl.
CPC ............ *G03F 7/32* (2013.01); *G02B 5/1866* (2013.01); *G03F 1/38* (2013.01); *G03F 7/0007* (2013.01); *G03F 7/16* (2013.01); *G03F 7/20* (2013.01); *G03F 7/2053* (2013.01)

(58) Field of Classification Search
CPC ..... G03F 1/38; G03F 1/44; G03F 1/76; G03F 7/2053; G03F 7/20; G03F 7/2002; G02B 5/1866
USPC ..................... 430/5, 319, 321, 945
See application file for complete search history.

(56) References Cited

U.S. PATENT DOCUMENTS

| | | | | |
|---|---|---|---|---|
| 5,731,109 A | * | 3/1998 | Hwang | .................. G03F 1/144 430/5 |
| 6,043,000 A | * | 3/2000 | Park | ......................... G03F 1/14 257/E21.027 |
| 6,114,074 A | * | 9/2000 | Carpi | ..................... G03F 1/144 430/5 |

(Continued)

FOREIGN PATENT DOCUMENTS

| | | |
|---|---|---|
| JP | 2009-216996 | 9/2009 |
| KR | 1997-0003399 | 1/1997 |

(Continued)

*Primary Examiner* — John A McPherson
(74) *Attorney, Agent, or Firm* — F. Chau & Associates, LLC

(57) ABSTRACT

A mask includes a transparent substrate and a light blocking pattern. The light blocking pattern includes a light blocking part and a diffraction pattern. The light blocking part is disposed on the transparent substrate and is configured to block light. The diffraction pattern includes a plurality of protrusion parts and is configured to diffract the light. The plurality of protrusion parts protrudes from a side of the blocking part and is separated from each other.

16 Claims, 8 Drawing Sheets

(56) References Cited

U.S. PATENT DOCUMENTS

| | | | | |
|---|---|---|---|---|
| 2001/0041310 | A1* | 11/2001 | Bae | G02F 1/13458 |
| | | | | 430/318 |
| 2003/0096175 | A1* | 5/2003 | Higashi | G03F 1/144 |
| | | | | 430/5 |
| 2009/0109364 | A1* | 4/2009 | Yang | G03F 1/14 |
| | | | | 349/46 |
| 2015/0093687 | A1* | 4/2015 | Kim | G03F 1/00 |
| | | | | 430/5 |

FOREIGN PATENT DOCUMENTS

| | | |
|---|---|---|
| KR | 1020050075634 | 7/2005 |
| KR | 1020070003180 | 1/2007 |
| KR | 1020100046661 | 5/2010 |
| KR | 1020140048062 | 4/2014 |

* cited by examiner

MASK, METHOD OF MANUFACTURING THE SAME, AND METHOD OF MANUFACTURING A DISPLAY PANEL USING THE SAME

CROSS-REFERENCE TO RELATED APPLICATION

This application claims priority under 35 U.S.C. §119 to Korean Patent Application No. 10-2014-0139109, filed on Oct. 15, 2014, in the Korean Intellectual Property Office (KIPO), the disclosure of which is incorporated by reference herein in its entirety.

TECHNICAL FIELD

Exemplary embodiments of the present inventive concept relate to a display apparatus, and more particularly to, a mask, a method of manufacturing the mask, and a method of manufacturing a display panel using the mask.

DISCUSSION OF THE RELATED ART

A liquid crystal display (LCD) apparatus includes a flat panel display (FPD). Examples of the FPD include, but are not limited to, a liquid crystal display (LCD), a plasma display panel (PDP), an organic light emitting display (OLED) or the like.

In the LCD apparatus, voltages are applied to liquid crystal layer therein to adjust the arrangements of molecules of the liquid crystal layer and thus, optical characteristics in the liquid crystal layer are changed to display a desired image.

The LCD apparatus includes an LCD panel displaying an image. The LCD panel includes a line pattern formed by an exposure process and an etching process using a mask.

A width of the line pattern may be reduced by applying a high photosensitive photoresist and increasing a resolution of a stepper. In this case, however, manufacturing cost may increase due to the use of the stepper. Thus, to reduce the manufacturing cost, exposure efficiency may be increased using a phase shifting mask.

SUMMARY

According to an exemplary embodiment of the present inventive concept, a mask is provided. The mask includes a transparent substrate and a light blocking pattern. The light blocking pattern includes a light blocking part and a diffraction pattern. The light blocking part is disposed on the transparent substrate and is configured to block light. The diffraction pattern includes a plurality of protrusion parts and is configured to diffract the light. The plurality of protrusion parts protrudes from a side of the blocking part and each of the protrusion parts are separated from each other.

In an exemplary embodiment of the present inventive concept, the light blocking pattern may include chromium (Cr).

In an exemplary embodiment of the present inventive concept, the light blocking part may have a rectangular shape.

In an exemplary embodiment of the present inventive concept, the plurality of protrusion parts may have a separation distance that is substantially within a range of 1 μm to 2 μm.

In an exemplary embodiment of the present inventive concept, the plurality of protrusion parts may be extended with a length that is substantially within a range of 0.1 μm to 2 μm in a direction substantially perpendicular to the side of the light blocking part.

In an exemplary embodiment of the present inventive concept, the plurality of protrusion parts may be extended with a length that is substantially within a range of 1 μm to 2 μm in a direction substantially parallel with the side of the light blocking part.

In an exemplary embodiment of the present inventive concept, the diffraction pattern may include a first protrusion pattern protruding from a first side of the light blocking part and a second protrusion pattern protruding from a second side of the light blocking part opposite to the first side of the light blocking part. The first protrusion pattern and the second protrusion pattern may be symmetric with respect to each other.

In an exemplary embodiment of the present inventive concept, the diffraction pattern may include a first protrusion pattern protruding from a first side of the light blocking part and a second protrusion pattern protruding from a second side of the light blocking part opposite to the first side of the light blocking part. The first protrusion pattern and the second protrusion pattern may be asymmetric with respect to each other.

According to an exemplary embodiment of the present inventive concept, a method of manufacturing a mask is provided. In the method, a light blocking metal layer is formed on a transparent substrate. A first photoresist material is coated on the light blocking metal layer to form a first photoresist layer. The first photoresist layer is irradiated by a laser beam to cure a first area and a second area. The second area includes a plurality of protrusion areas which protrudes from a side of the first area. Each of the plurality of protrusion areas is separated from each other. The first photoresist layer is developed to form a first photo pattern. The light blocking metal layer is etched by using the first photo pattern as a mask to form a light blocking pattern. The light blocking pattern includes a light blocking part and a diffraction pattern. The light blocking part corresponds to the first area. The diffraction pattern corresponds to the second area.

In an exemplary embodiment of the present inventive concept, the first photoresist material may include a negative photoresist.

In an exemplary embodiment of the present inventive concept, the first area may be cured by moving a point output from the laser beam in a first direction on the first photoresist layer.

In an exemplary embodiment of the present inventive concept, the second area may be cured by moving the point in a second direction on the first photoresist layer, the second direction substantially being perpendicular to the first direction.

In an exemplary embodiment of the present inventive concept, the point may have a diameter that is substantially within a range of 0.5 μm to 1.5 μm.

In an exemplary embodiment of the present inventive concept, the light blocking metal layer may include chromium (Cr).

According to exemplary embodiment of the present inventive concept, a method of manufacturing a display panel is provided. In the method, a metal layer is formed on a base substrate. A first photoresist material is coated on the metal layer to form a first photoresist layer. The first photoresist layer is exposed using a plurality of masks including a transparent substrate and a light blocking pattern. The first photoresist layer is developed to form a first photo pattern. The light blocking pattern includes a light blocking part and a diffraction pattern. The light blocking part is disposed on the transparent substrate and is configured to block light. The diffraction pattern includes a plurality of protrusion parts and is configured to diffract the light. The plurality of protrusion parts protrudes from a side of the light blocking part and each of the protrusion parts is separated from each other.

In an exemplary embodiment of the present inventive concept, the first photoresist material may include a positive photoresist.

In an exemplary embodiment of the present inventive concept, the first photoresist layer may be exposed with an exposure amount that is substantially within a range of 40 mJ to 50 mJ. The first photo pattern may have a width that is substantially within a range of 2.5 µm to 3.5 µm in an area corresponding to the light blocking pattern.

In an exemplary embodiment of the present inventive concept, the plurality of protrusion parts may have a separation distance that is substantially within a range of 1 µm to 2 µm.

In an exemplary embodiment of the present inventive concept, the plurality of protrusion parts may be extended with a length that is substantially within a range of 0.1 µm to 2 µm in a direction substantially perpendicular to the side of the light blocking part.

In an exemplary embodiment of the present inventive concept, the plurality of protrusion parts may be extended with a length that is substantially within a range of 1 µm to 2 µm in a direction substantially parallel with the side of the light blocking part.

According to an exemplary embodiment of the present inventive concept, a method of manufacturing a display panel is provided. In the method, a metal layer is formed on a base substrate. A first photoresist material is coated on the metal layer to form a first photoresist layer. The first photoresist layer is exposed using a plurality of masks including a light blocking part and a diffraction pattern. The first photoresist layer is developed to form a first photo pattern. The light blocking part is configured to block light. The diffraction pattern is configured to diffract the light. Each of the plurality of masks is separated from each other by a distance that is substantially within a range of 2.5 µm to 3.5 µm.

BRIEF DESCRIPTION OF THE DRAWINGS

Illustrative, non-limiting exemplary embodiments of the present inventive concept will be more clearly understood from the following detailed description taken in conjunction with the accompanying drawings, in which.

DETAILED DESCRIPTION OF THE EMBODIMENTS

Figure 1:
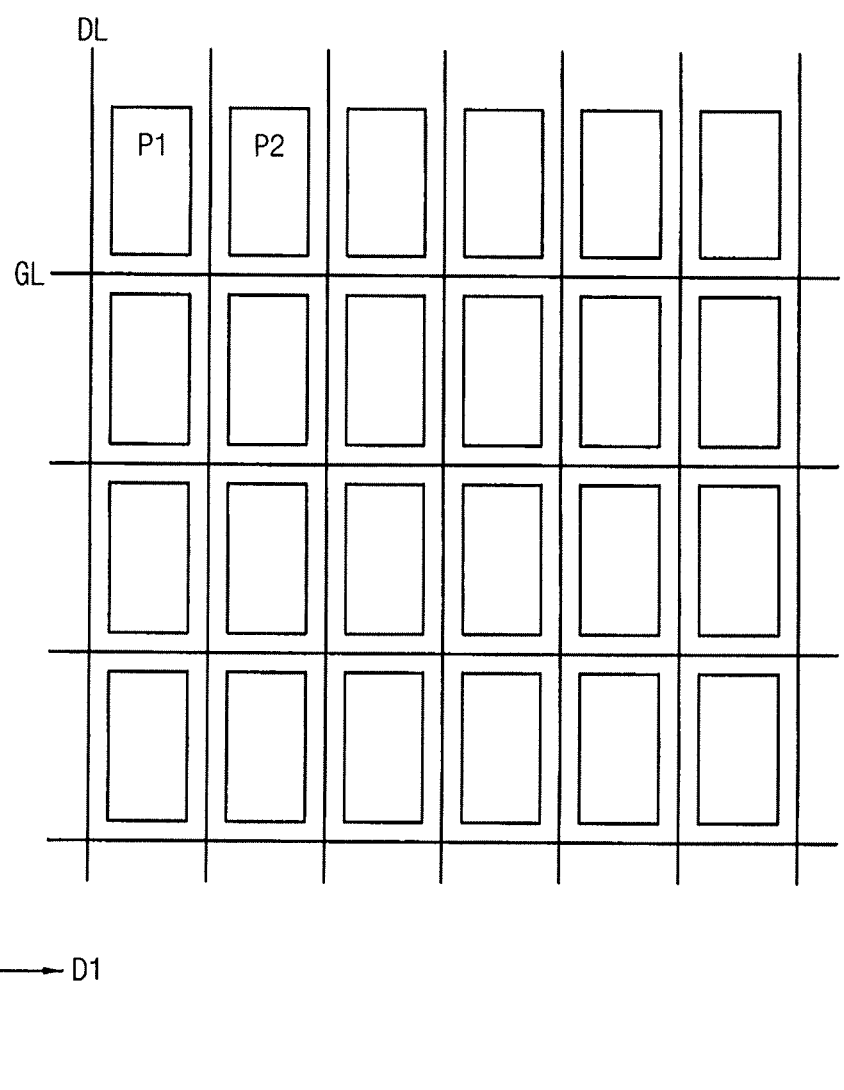
FIG. 1 is a plan view illustrating a display panel according to an exemplary embodiment of the present inventive concept.

Exemplary embodiments of the present inventive concept will be described more fully with reference to the accompanying drawings. The present inventive concept may, however, be embodied in many different forms and should not be construed as being limited to the embodiments set forth herein. Like reference numerals may refer to like elements throughout this application.

As used herein, the term "and/or" includes any and all combinations of one or more of the associated listed items.

It will be understood that when an element is referred to as being "connected" or "coupled" to another element, it can be directly connected or coupled to the other element or intervening elements may be present.

As used herein, the singular forms "a," "an" and "the" are intended to include the plural forms as well, unless the context clearly indicates otherwise.

Figure 2:
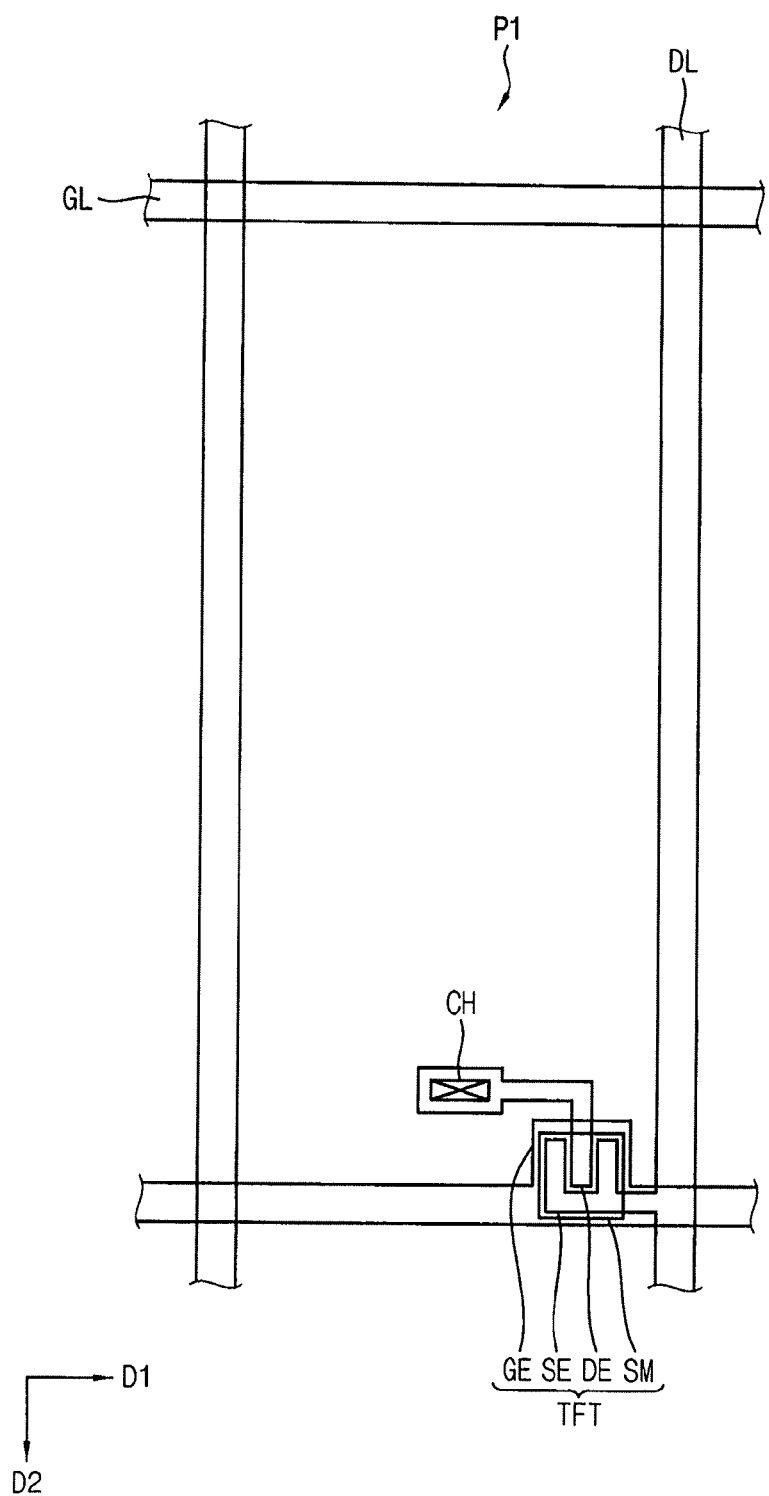
FIG. 2 is a plan view illustrating a first pixel included in the display panel of FIG. 1 according to an exemplary embodiment of the present inventive concept.

FIG. 1 is a plan view illustrating a display panel according to an exemplary embodiment of the present inventive concept. FIG. 2 is a plan view illustrating a first pixel included in the display panel of FIG. 1 according to an exemplary embodiment of the present inventive concept.

Referring to FIG. 1, the display panel includes a plurality of gate lines GL, a plurality of data lines DL, and a plurality of pixels.

The plurality of gate lines GL may extend in a first direction D1, and the plurality of data lines DL may extend in a second direction D2 crossing (e.g., substantially perpendicular to) the first direction D1. In an exemplary embodiment of the present inventive concept, the plurality of gate lines GL may extend in the second direction D2, and the plurality of data lines DL may extend in the first direction D1.

The plurality of pixels may be arranged in a matrix form. The plurality of pixels may be disposed in a plurality of pixel areas that are defined by the plurality of gate lines GL and the plurality of data lines DL.

Each pixel may be connected to a respective one of the gate lines (e.g., an adjacent one of the gate lines) and a respective one of the data lines (e.g., an adjacent one of the data lines). For example, a first pixel P1 may be connected to a gate line GL and a data line DL. Each pixel may have a rectangular shape, a V shape, a Z shape, etc. However, the present inventive concept is not limited thereto.

Referring to FIGS. 1 and 2, the display panel includes a substrate including a plurality of pixel areas configured to display an image and a thin film transistor TFT. The plurality of pixel areas is arranged in a matrix form having a plurality of columns and a plurality of rows.

Each pixel may include a switching element. For example, the thin film transistor TFT may be the switching element. The switching element may be connected to a respective one of the gate lines (e.g., an adjacent one of the gate lines) and a respective one of the data lines (e.g., an adjacent one of the data lines). The switching element may be disposed on an area where the gate line GL and the data line DL intersect.

A gate pattern may be disposed on the substrate. The gate pattern may include a gate electrode GE and a gate line GL. The gate line GL may be electrically connected to the gate electrode GE.

A semiconductor pattern SM may be disposed on the substrate. The semiconductor pattern SM may overlap the gate electrode GE.

A data pattern including a data line DL, a source electrode SE, and a drain electrode DE may be disposed on the semiconductor pattern SM. The source electrode SE overlaps the semiconductor pattern SM and is electrically connected to the data line DL.

The drain electrode DE may be spaced apart from the source electrode SE with respect to the semiconductor pattern SM. The semiconductor pattern SM may have a conductive channel between the source electrode SE and the drain electrode DE.

The thin film transistor TFT comprises the gate electrode GE, the source electrode SE, the drain electrode DE, and the semiconductor pattern SM.

For example, a width of the gate electrode GE, a width of the source electrode SE, and a width of the drain electrode DE may be smaller than 2.5 μm.

Figure 3A:
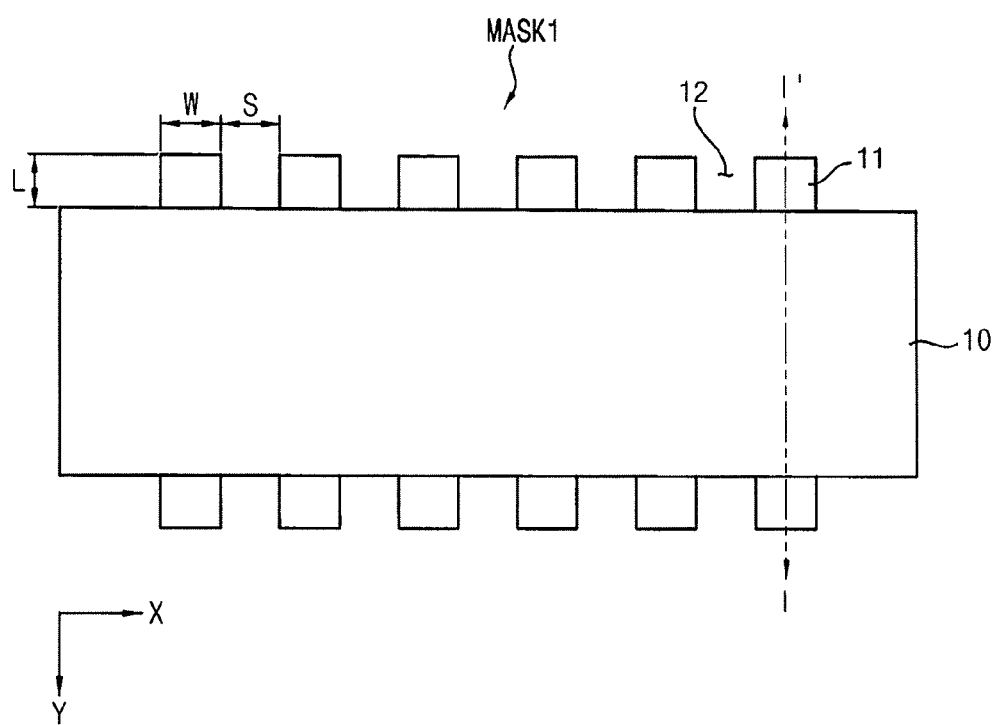
FIG. 3A is a plan view illustrating a mask according to an exemplary embodiment of the present inventive concept.
Figure 3B:
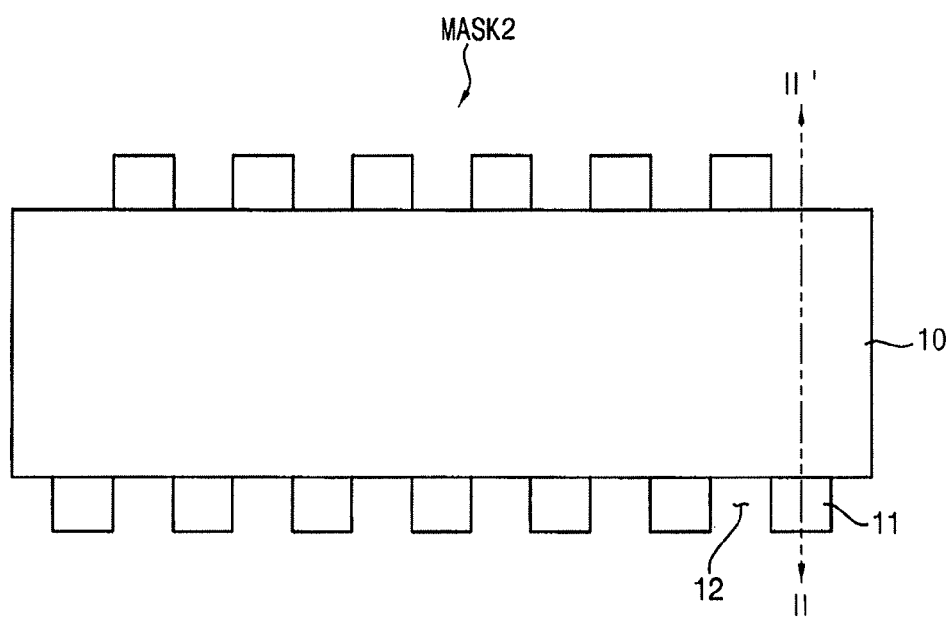
FIG. 3B is a plan view illustrating a mask according to an exemplary embodiment of the present inventive concept.
Figure 4A:
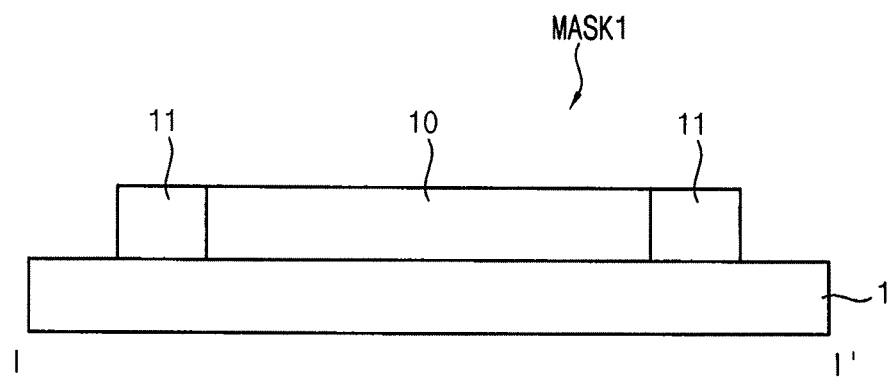
FIG. 4A is a cross-sectional view illustrating the mask taken along the line I-I' of FIG. 3A according to an exemplary embodiment of the present inventive concept.
Figure 4B:
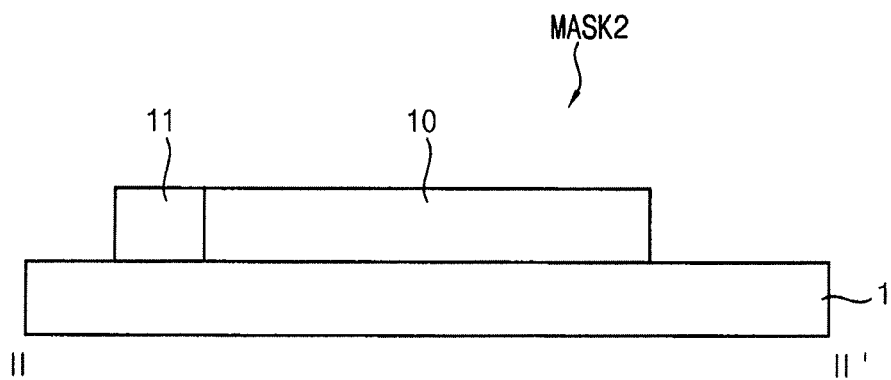
FIG. 4B is a cross-sectional view illustrating the mask taken along the line II-II' of FIG. 3B according to an exemplary embodiment of the present inventive concept.
Figure 5A:
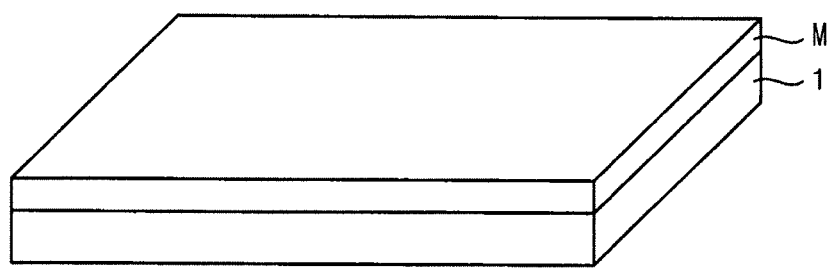
FIGS. 5A, 5B, 5C, and 5D are perspective views for describing a method of manufacturing the mask of FIG. 3A according to an exemplary embodiment of the present inventive concept.
Figure 5B:
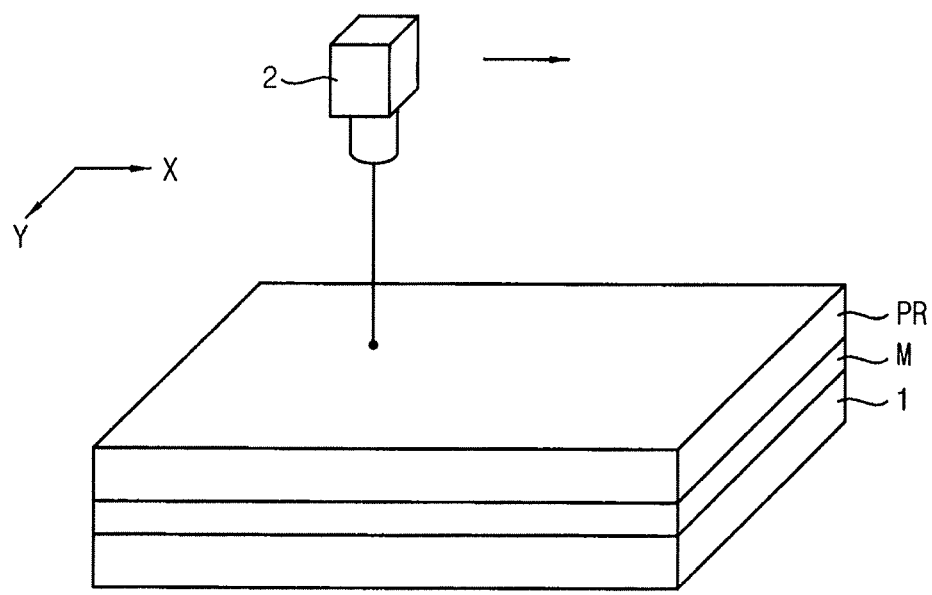
Figure 5C:
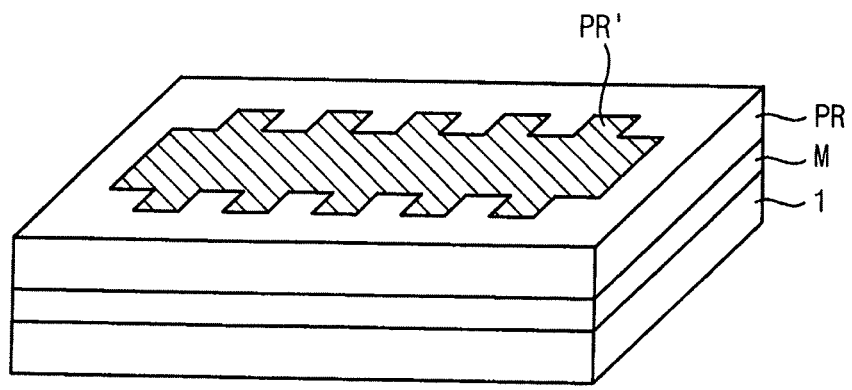
Figure 5D:
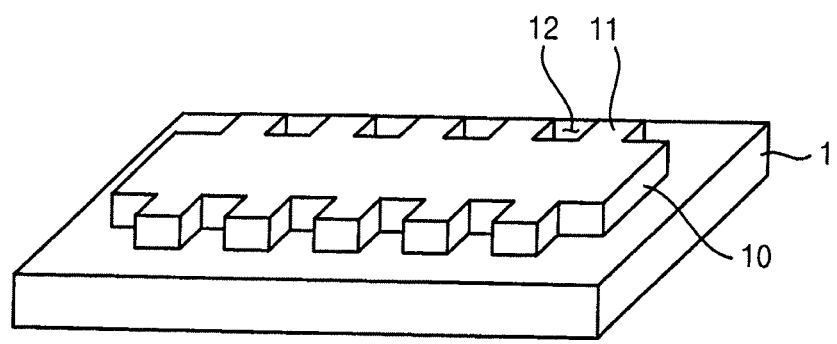

FIG. 3A is a plan view illustrating a mask according to an exemplary embodiment of the present inventive concept. FIG. 3B is a plan view illustrating a mask according to an exemplary embodiment of the present inventive concept. FIG. 4A is a cross-sectional view illustrating the mask taken along the line I-I' of FIG. 3A according to an exemplary embodiment of the present inventive concept. FIG. 4B is a cross-sectional view illustrating the mask taken along the line II-II' of FIG. 3B according to an exemplary embodiment of the present inventive concept. FIGS. 5A, 5B, 5C, and 5D are perspective views for describing a method of manufacturing the mask of FIG. 3A according to an exemplary embodiment of the present inventive concept.

Referring to FIGS. 3A and 4A, a first mask MASK 1 includes a transparent substrate 1 and a light blocking pattern.

For example, the transparent substrate 1 may be a glass substrate, a transparent plastic substrate, or the like.

The light blocking pattern is disposed on the transparent substrate 1. For example, the light blocking pattern may include chromium (Cr).

The light blocking pattern includes a light blocking part 10 and a diffraction pattern.

The light blocking part 10 may block light toward the light blocking part 10.

The diffraction pattern includes a plurality of protrusion parts 11 protruding from a side of the light blocking part 10. A plurality of separation spaces 12 is disposed between the protrusion parts 11. For example, each separation space may be disposed between two adjacent protrusion parts.

The diffraction pattern includes the plurality of protrusion parts 11 and the separation spaces 12 between the plurality of protrusion parts 11, and thus light toward the diffraction pattern can be diffracted. Thus, an amount of light exposed on a first photoresist layer can be increased due to an interference of the light diffracted through the diffraction pattern.

For example, the light blocking part 10 has a rectangular shape having long sides and short sides. The protrusion parts 11 may protrude from the long sides of the light blocking part 10.

For example, the protrusion parts 11 have a separation distance S of about 1 μm to about 2 μm. For example, each separation space disposed between two adjacent protrusion may have a separation distance S of about 1 μm to about 2 μm.

When the separation distance S is shorter than 1 μm, an area of the protrusion part 11 increases, an amount of light passing through the diffraction pattern decreases, and thus, an amount of light exposure during a photo process increases. In addition, when the separation distance S is longer than 2 μm, an area of each protrusion part 11 decreases, and thus the light might not be diffracted.

The protrusion parts 11 may be extended with a length of about 0.1 μm to about 2 μm in a direction substantially perpendicular to a side (e.g., the long side or the short side) of the light blocking part 10. For example, the protrusion parts 11 may be extended with a length of about 0.5 μm to about 1.5 μm in the direction substantially perpendicular to the side of the light blocking part 10.

When lengths of the protrusion parts 11 extended in the direction substantially perpendicular to the side of the light blocking part 10 are shorter than 0.1 μm, the area of each protrusion part 11 decreases, and thus the light might not be diffracted. When the lengths of the protrusion parts 11 extended in the direction substantially perpendicular to the side of the light blocking part 10 are longer than 2 μm, the area of each protrusion part 11 increases, an amount of the light passing through the diffraction pattern decreases, and thus an amount of light exposure during the photo process increases.

In an exemplary embodiment of the present inventive concept, the protrusion parts 11 may be extended with a length of about 1 μm to about 2 μm in a direction substantially parallel with a side (e.g., the long side or the short side) of the light blocking part 10.

When lengths of the protrusion parts 11 extended in the direction substantially parallel with the side of the light blocking part 10 are shorter than 1 μm, the area of each protrusion part 11 decreases, and thus the light might not be diffracted. When the lengths of the protrusion parts 11 extended in the direction substantially parallel with the side of the light blocking part 10 are longer than 2 μm, the area of the protrusion part 11 increases, an amount of the light passing through the diffraction pattern decreases, and thus an amount of light exposure during the photo process increases.

The protrusion parts 11 and the separation spaces 12 are formed to be shorter than 2.5 μm which may be a resolution limit of a stepper. Thus, the diffraction pattern included in the first mask MASK1 might not affect a shape of a photo pattern.

The diffraction pattern includes a first protrusion pattern and a second protrusion pattern. The first protrusion pattern protrudes from a first side of the light blocking part 10. The second protrusion pattern protrudes from a second side of the light blocking part 10 opposite to the first side. For example, the second side may be opposite to the first side with respect to the light blocking part 10.

For example, the first protrusion pattern and the second protrusion pattern may have a symmetric structure.

Referring to FIGS. 3B and 4B, a second mask MASK2 includes a transparent substrate 1 and a light blocking pattern.

The light blocking pattern includes a light blocking part 10 and a diffraction pattern.

For example, the light blocking part 10 may have a rectangular shape.

The diffraction pattern includes a plurality of protrusion parts 11 protruding from a side of the light blocking part 10. A plurality of separation spaces 12 is disposed between the protrusion parts 11. For example, each separation space 12 may be disposed between the protrusion parts 11 adjacent to each other.

The diffraction pattern includes the plurality of protrusion parts 11 and the separation spaces 12 between the plurality of diffraction parts 11, and thus light toward the diffraction pattern can be diffracted. Thus, an amount of light exposed on a first photoresist layer can be increased due to an interference of the light diffracted through the diffraction pattern.

For example, the light blocking part 10 has a rectangular shape having long sides and short sides. The protrusion parts 11 may protrude from the long sides of the light blocking part 10.

The protrusion parts 11 may be extended with a length of about 0.1 μm to about 2 μm in a direction substantially perpendicular to a side (e.g., the long side or the short side) of the light blocking part 10. For example, the protrusion parts 11 may be extended with a length of about 0.5 μm to about 1.5 μm in the direction substantially perpendicular to the side of the light blocking part 10.

In an exemplary embodiment of the present inventive concept, the protrusion parts 11 may be extended with a length of about 1 μm to about 2 μm in a direction substantially parallel with a side (e.g., the long side or the short side) of the light blocking part 10.

The protrusion parts 11 and the separation spaces 12 are formed to be shorter than 25 μm which may be a resolution limit of a stepper. Thus, the diffraction pattern included in the second mask MASK2 might not affect a shape of a photo pattern.

The diffraction pattern includes a first protrusion pattern and/or a second protrusion pattern. The first protrusion pattern protrudes from a first side of the light blocking part 10. The second protrusion pattern protrudes from a second side of the light blocking part 10 opposite to the first side. For example, the second side may be opposite to the first side with respect to the light blocking part 10.

For example, the first protrusion pattern and the second protrusion pattern may have an asymmetric structure.

Referring to FIGS. 5A, 5B, 5C, and 5D, a light blocking metal layer M is formed on a transparent substrate 1.

The light blocking metal layer M may include a material reflecting light. For example, the light blocking metal may include chromium Cr.

A first photoresist material is coated on the transparent substrate 1 where the light blocking metal layer M is formed to form a first photoresist layer PR.

For example, the first photoresist material may include a negative photoresist.

A first area and a second area including protrusion areas may be cured by a laser beam 2. The protrusion areas protrude from a side of the first area and each of the protrusion area is separated from each other.

The first area may be cured by moving a point output from the laser beam 2. The point may be moved to an X direction X on the first photoresist layer PR to cure the first area.

The second area may be cured by moving a point output from the laser beam 2. The point may be moved to a Y direction Y on the first photoresist layer PR to cure the second area.

For example, a diameter of the point output from the laser beam 2 may be about 0.5 μm to about 1.5 μm.

A first photo pattern PR' may be formed by curing the first area and the second area.

For example, a remaining area of the first photoresist layer PR except the first photo pattern PR' may be developed by using a developer to form the first photo pattern PR'.

The light blocking metal layer M is etched by using the first photo pattern PR' as a mask to form a light blocking pattern.

For example, the light blocking metal layer M may be etched by using an etchant.

The light blocking pattern includes a light blocking part 10 and a diffraction pattern.

The light blocking part 10 corresponds to the first area.

For example, the light blocking part 10 may have a rectangular shape.

The diffraction pattern corresponds to the second area. The diffraction pattern includes a plurality of protrusion parts 11 which protrudes from a side of the light blocking part 10 and is separated from each other.

The diffraction pattern includes a plurality of protrusion parts 11 protruding from a side of the light blocking part 10. A separation space 12 is disposed between the protrusion parts 11 adjacent to each other.

The diffraction pattern includes the plurality of protrusion parts 11 and the separation spaces 12 between the plurality of protrusion parts 11, and thus light toward the diffraction pattern can be diffracted. Thus, an amount of light exposed on the first photoresist layer PR can be increased due to an interference of the light diffracted through the diffraction pattern.

For example, the light blocking part 10 has a rectangular shape having long sides and short sides. The protrusion parts 11 may protrude from the long sides of the light blocking part 10.

For example, the separation spaces 12 disposed between the protrusion parts 11 adjacent to each other may have a separation distance S of about 1 μm to about 2 μm.

The protrusion parts 11 may be extended with a length of about 0.1 μm to about 2 μm in a direction substantially perpendicular to a side (e.g., the long side or the short side) of the light blocking part 10. For example, the protrusion parts 11 may be extended with a length of about 0.5 μm to about 1.5 μm in the direction substantially perpendicular to the side of the light blocking part 10.

In an exemplary embodiment of the present inventive concept, the protrusion parts 11 may be extended with a length of about 1 μm to about 2 μm in a direction substantially parallel with a side (e.g., the long side or the short side) of the light blocking part 10.

The protrusion parts 11 and the separation spaces 12 are formed to be shorter than 2.5 μm which may be a resolution limit of a stepper. Thus, the diffraction pattern included in the first mask MASK1 might not affect a shape of a photo pattern.

Figure 6A:
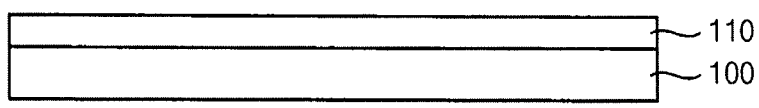
FIGS. 6A, 6B, and 6C are plan views for describing a method of manufacturing a display panel using the mask of FIG. 3A according to an exemplary embodiment of the present inventive concept.
Figure 6B:
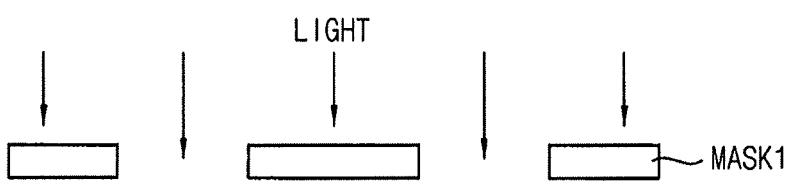
Figure 6B:
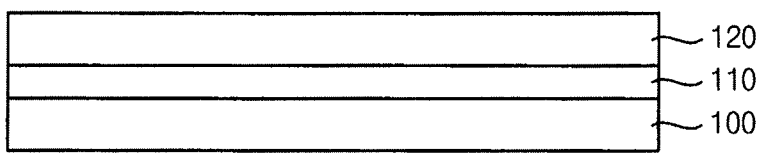
Figure 6C:
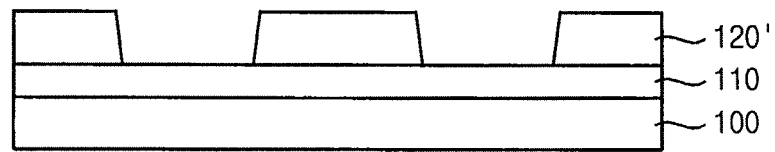

FIGS. 6A, 6B, and 6C are plan views for describing a method of manufacturing a display panel using the mask of FIG. 3A according to an exemplary embodiment of the present inventive concept.

Referring to FIGS. 6A, 6B, and 6C, a metal layer 110 is formed on a base substrate 100.

The metal layer 110 may include copper Cu, copper alloy, or the like.

For example, the metal layer 110 may be a layer for forming a gate pattern including a gate electrode GE and a gate line GL.

For example, the metal layer 110 may be a layer for forming a data pattern including a source electrode SE, a drain electrode DE, and a data line DL.

A second photoresist material is coated on the metal layer 110 to form a second photoresist layer 120.

For example, the second photoresist material may include a positive photoresist.

The second photoresist layer 120 is exposed by using a plurality of masks MASK1 on the second photoresist layer 120.

The light blocking pattern of each mask MASK1 includes a light blocking part 10 and a diffraction pattern.

For example, the light blocking part 10 may have a rectangular shape.

The diffraction pattern includes a plurality of protrusion parts 11 protruding from a side of the light blocking part 10. A plurality of separation spaces 12 is disposed between the protrusion parts 11. For example, each separation space 12 is disposed between two adjacent protrusion parts 11.

The diffraction pattern includes the plurality of protrusion parts 11 and the separation spaces 12 between the plurality of protrusion 11, and thus light toward the diffraction pattern can be diffracted. Thus, an amount of light exposed on the second photoresist layer 120 can be increased due to an interference of the light diffracted through the diffraction pattern.

For example, the light blocking part 10 has a rectangular shape having long sides and short sides. The protrusion parts 11 may protrude from the long sides of the light blocking part 10.

For example, the separation space 12 disposed between the protrusion parts 11 adjacent to each other may have a separation distance S of about 1 μm to about 2 μm.

The protrusion parts 11 may be extended with a length of about 0.1 μm to about 2 μm in a direction substantially perpendicular to a side of the light blocking part 10. For example, the protrusion parts 11 may be extended with a length of about 0.5 μm to about 1.5 μm in the direction substantially perpendicular to the side of the light blocking part 10.

In an exemplary embodiment of the present inventive concept, the protrusion parts 11 may be extended with a length of about 1 μm to about 2 μm in a direction substantially parallel with a side of the light blocking part 10.

The protrusion parts 11 and the separation spaces 12 are formed to be shorter than 2.5 μm which may be a resolution limit of a stepper. Thus, the diffraction pattern included in the first mask MASK1 might not affect a shape of a photo pattern.

Each of the plurality of masks MASK1 may be disposed separately from each other. The plurality of masks MASK1 may be separated corresponding to a width of a second photo pattern 120'. For example, the plurality of masks MASK1 may have a separation distance of about 2.5 μm to about 3.5 μm.

For example, the second photoresist layer 120 may be exposed with an exposure amount of about 40 mJ to about 50 mJ. Thus, the second photo pattern 120' may be formed with a width of 2.5 μm to about 3.5 μm in an area corresponding to the light blocking pattern.

The second photoresist layer 120 is developed to form the second photo pattern 120'.

The above-described exemplary embodiments of the present inventive concept may be used in a display apparatus including a thin film transistor such as a LCD apparatus, an OLED apparatus, or the like, and/or a system including the display apparatus.

The foregoing is illustrative of exemplary embodiments of the present inventive concept and the present inventive concept should not be construed as limiting. Although a few exemplary embodiments of the present inventive concept have been described, it will be understood that many modifications in form and details may be made therein without departing from the spirit and scope of the present inventive concept.

What is claimed is:

1. A mask, comprising:
a transparent substrate; and
a light blocking pattern,
wherein the light blocking pattern comprises:
 a light blocking part disposed on the transparent substrate, wherein the light blocking part is configured to block light; and
 a diffraction pattern including a plurality of protrusion parts, wherein the diffraction pattern is configured to diffract the light, and the plurality of protrusion parts includes a first set of protrusion parts and a second set of protrusion parts, wherein each of the first set of protrusion parts protrudes from a first side of the light blocking part and each of the first set of protrusion parts is separated from one another,
wherein each of the second set of protrusion parts protrudes from a second side of light blocking part and each of the second set of protrusion parts is separated from one another, the second side of the light blocking part being opposite to the first side of the light blocking part, and
wherein an arrangement of the first and second sets of protrusion parts is asymmetric with respect to a line that extends parallel to the first side of the light blocking part.

2. The mask of claim 1, wherein the light blocking pattern includes chromium (Cr).

3. The mask of claim 1, wherein the light blocking part has a rectangular shape.

4. The mask of claim 1, wherein a separation distance between two adjacent protrusion parts of the first set of protrusion parts is in a range of about 1 μm to about 2 μm, and
wherein a separation distance between two adjacent protrusion parts of the second set of protrusion parts is in a range of about 1 μm to about 2 μm.

5. The mask of claim 1, wherein
at least one of the first set of protrusion parts has a length that is within a range of about 0.1 μm to about 2 μm in a direction substantially perpendicular to the first side of the light blocking part, and
at least one of the second set of protrusion parts has a length that is within a range of about 0.1 μm to about 2 μm in a direction substantially perpendicular to the second side of the light blocking part.

6. The mask of claim 5, wherein
the at least one of the first set of protrusion parts has a length that is within a range of about 0.1 μm to about 2 μm in a direction substantially parallel to the first side of the light blocking part, and
the at least one of the second set of protrusion parts has a length that is within a range of about 0.1 μm to about 2 μm in a direction substantially parallel to the second side of the light blocking part.

7. A method of manufacturing a mask, the method comprising:
forming a light blocking metal layer on a transparent substrate;
coating a first photoresist material on the light blocking metal layer to form a first photoresist layer;
irradiating the first photoresist layer using a laser beam to cure a first area and a second area, wherein the second area includes a plurality of protrusion areas protruding from a side of the first area, and each of the plurality of protrusion areas is separated from each other;
developing the first photoresist layer to form a first photo pattern; and
etching the light blocking metal layer by using the first photo pattern as a mask to form a light blocking pattern including a light blocking part and a diffraction pattern,
wherein the light blocking part corresponds to the first area, and the diffraction pattern corresponds to the second area,
wherein the first area is cured by moving a point output from the laser beam in a first direction on the first photoresist layer, and
wherein the second area is cured by moving the point output in a second direction on the first photoresist layer, the second direction being substantially perpendicular to the first direction.

8. The method of claim 7, wherein the first photoresist material includes a negative photoresist.

9. The method of claim 7, wherein the point output has a diameter that is within a range of about 0.5 μm to about 1.5 μm.

10. A method of manufacturing a display panel, the method comprising:
forming a metal layer on a base substrate;
coating a first photoresist material on the metal layer to form a first photoresist layer;
exposing the first photoresist layer by using a mask, the mask including a transparent substrate and a light blocking pattern; and
developing the first photoresist layer to form a first photo pattern,
wherein the light blocking pattern includes a light blocking part and a diffraction pattern,
wherein the light blocking part is disposed on the transparent substrate and is configured to block light,
wherein the diffraction pattern includes a plurality of first protrusion parts protruding from a first side of the light blocking part and a plurality of second protrusion parts protruding from a second side of the light blocking part, the first and second sides of the light blocking part being opposite to each other, wherein the plurality of first and second protrusion parts is configured to diffract the light, and
wherein the plurality of first and second protrusion parts are asymmetrically arranged with respect to a direction along which the first side of the light blocking part extends.

11. The method of claim 10, wherein the first photoresist material includes a positive photoresist.

12. The method of claim 10, wherein the first photoresist layer is exposed with an exposure amount that is substantially within a range of 40 mJ to 50 mJ, and
the first photo pattern has a width that is within a range of about 2.5 μm to about 3.5 μm in an area corresponding to the light blocking pattern.

13. The method of claim 10, wherein
a separation distance between two adjacent first protrusion parts is in a rage of about 1 μm to about 2 μm, and
wherein a separation distance between two adjacent second protrusion parts is in a range of about 1 μm to about 2 μm.

14. The method of claim 10, wherein at least one of the plurality of first protrusion parts has a length that is within a range of about 0.1 μm to about 2 μm in a direction substantially perpendicular to the first side of the light blocking part, and
at least one of the plurality of second protrusion parts has a length that is within a range of about 0.1 μm to about 2 μm in a direction substantially perpendicular to the second side of the light blocking part.

15. The method of claim 14, wherein
the at least one of the plurality of first protrusion parts has a length that is within a range of about 0.1 μm to about 2 μm in a direction substantially parallel to the first side of the light blocking part, and
the at least one of the plurality of second protrusion parts has a length that is within a range of about 0.1 μm to about 2 μm in a direction substantially parallel to the second side of the light blocking part.

16. A method of manufacturing a display panel, the method comprising:
forming a metal layer on a base substrate;
coating a first photoresist material on the metal layer to form a first photoresist layer;
exposing the first photoresist layer by using a plurality of masks, each of the plurality of masks including a light blocking part and a diffraction pattern; and
developing the first photoresist layer to form a first photo pattern,
wherein the light blocking part of each of the plurality of masks is configured to block light, and the diffraction pattern of each of the plurality of masks is configured to diffract the light, and
wherein the plurality of masks is separated from each other by a distance that is within a range of about 2.5 μm to about 3.5 μm.

* * * * *